United States Patent [19]

Ning et al.

[11] Patent Number: 4,785,341

[45] Date of Patent: Nov. 15, 1988

[54] INTERCONNECTION OF OPPOSITE CONDUCTIVITY TYPE SEMICONDUCTOR REGIONS

[75] Inventors: Tak H. Ning, Yorktown Heights; Siegfried K. Wiedmann, Peekskill, both of N.Y.

[73] Assignee: International Business Machines Corporation, Armonk, N.Y.

[21] Appl. No.: 136,480

[22] Filed: Dec. 24, 1987

Related U.S. Application Data

[63] Continuation of Ser. No. 858,091, Apr. 29, 1986, abandoned, which is a continuation of Ser. No. 295,461, Aug. 24, 1981, abandoned, which is a continuation of Ser. No. 53,661, Jun. 29, 1979, abandoned.

[51] Int. Cl.⁴ .......................................... H01L 27/04
[52] U.S. Cl. ...................................... 357/44; 357/59; 357/67; 357/71; 357/92
[58] Field of Search ................ 357/59, 92, 50, 67 S, 357/71 S, 71 P, 44

[56] References Cited

U.S. PATENT DOCUMENTS

| | | | |
|---|---|---|---|
| 3,381,182 | 4/1968 | Thronton | 357/49 |
| 3,519,901 | 7/1970 | Bean et al. | 357/22 |
| 3,673,471 | 6/1972 | Klein et al. | 357/42 |
| 3,777,364 | 12/1973 | Schinella et al. | 357/71 S |
| 3,806,361 | 4/1974 | Lehner | 357/59 |
| 3,821,781 | 6/1974 | Chang et al. | 357/42 |
| 4,041,522 | 8/1977 | Oguey et al. | 357/42 |
| 4,148,055 | 4/1979 | Edlinger et al. | 357/92 |
| 4,160,989 | 7/1979 | de Brebisson et al. | 357/92 |
| 4,161,745 | 7/1979 | Slob | 357/34 |
| 4,163,246 | 7/1979 | Aomura et al. | 357/71 P |
| 4,190,466 | 2/1980 | Bhattacharyya et al. | 357/51 |
| 4,333,099 | 6/1982 | Tanguay et al. | 357/67 S |
| 4,450,470 | 5/1984 | Shiba | 357/67 S |

FOREIGN PATENT DOCUMENTS

| | | | |
|---|---|---|---|
| 53-17393 | 6/1978 | Japan | 357/59 |
| 54-8078 | 4/1979 | Japan | 357/59 |

OTHER PUBLICATIONS

Berger et al, IBM Tech. Disclosure Bulletin, vol. 21, No. 12, May 1979, p. 4886 (357-59).
Ho et al, IBM Tech. Disclosure Bulletin, vol. 21, No. 12, May 1979, pp. 4843-4844 (357-59).
Dingwall et al, IEEE International Electron Device Meeting, Technical Digest, Dec. 3, 1978, pp. 193-196.

*Primary Examiner*—William D. Larkins
*Attorney, Agent, or Firm*—Jackson E. Stanland

[57] ABSTRACT

A technique for making ohmic electrical interconnections between semiconductor regions of opposite conductivity type, without requiring metallic interconnection lines. This technique has applicability in any circuit using bipolar devices, and in particular is useful to provide a very dense static memory array of bipolar transistors. To join the opposite conductivity regions, intermediate layers are formed including a silicide of a refractory metal, such as W, Mo, Ta, etc. and at least one layer of doped polycrystalline semiconductor material. For a single crystal of silicon having N and P type regions, the refractory metal silicide forms an electrical connection to at least one doped polysilicon layer of a first conductivity type and to either a single crystal semiconductor region of the opposite conductivity type or to another polysilicon layer which also has the opposite conductivity type. As an example, an N type silicon region is interconnected to a P type silicon region by intermediate layers of N polysilicon—refractory metal silicide—P polysilicon.

2 Claims, 5 Drawing Sheets

INTERCONNECTION OF OPPOSITE CONDUCTIVITY TYPE SEMICONDUCTOR REGIONS

This is a continuation of Ser. No. 06/858,091 filed 04/29/1986, now abandoned, which was a continuation of Ser. No. 06/295,461 filed 08/24/81, now abandoned, which was a continuation of 06/053,661 filed 06/29/1979, now abandoned.

TECHNICAL FIELD

This invention relates to semiconductor technology, and in particular to a technique for ohmically interconnecting N and P regions.

BACKGROUND ART

In the semiconductor art, many schemes are known for interconnecting the various regions of a semiconductor device. These regions include those having P type conductivity and also those having N type conductivity. Generally, it has been quite simple to interconnect semiconductor regions of the same conductivity type, as for example by using a doped polycrystalline material comprised of the same semiconductor as is used to make the device itself. For example, in the case of a silicon semiconductor device having a plurality of N type regions which must be interconnected, a common interconnection is the use of N doped polysilicon. Another interconnect material which has been used is a metal silicide, such as PtSi, which is known as an ohmic contact to P and N semiconductor regions, and as an interconnect material between regions of the same conductivity type. In the semiconductor art, the problem of making electrical interconnections between regions having opposite conductivity type has been a difficult one. Typically, metal lines are used to provide ohmic electrical interconnections between semiconductor regions of opposite conductivity types. However, the use of such metal interconnections reduces the density of arrays of such devices and leads to larger capacitances due to the large area required for each device cell. As an example, a static memory cell comprising bipolar transistors requires that electrical interconnections be made between N and P type regions of the circuit. In the past, these interconnections have been made by overlying metal lines, and the circuits could not be made small and fast.

In the prior art, metal silicides have been suggested as an interconnection material between semiconductor regions of the same conductivity type, and such metal silicides also have generally been used with polysilicon layers in order to reduce the resistance of the polysilicon layer. However, polysilicon has not been used or suggested for use in circuits utilizing bipolar devices where interconnections have to be made between regions of the opposite conductivity type. Thus, prior to the present invention, static memory arrays of bipolar transistors have not been produced which have sufficient commercial advantage to be competitive with other types of static memory cells.

In the practice of the present invention, a technique has been discovered for making interconnections between opposite conductivity regions in a manner which provides good ohmic electrical interconnections and which eliminates the need for some of the metal interconnect lines. This has provided arrays of static memory cells using bipolar transistors which are very dense.

Accordingly, it is a primary object of the present invention to provide a new technique for ohmically interconnecting opposite conductivity type regions in a semiconductor device circuit.

It is another object of the present invention to provide an ohmic interconnection between opposite conductivity types of semiconductor material, in order to provide more dense arrays of semiconductor circuits.

It is another object of the present invention to provide semiconductor circuits in which some metal interconnection lines are eliminated in order to reduce the cell size of devices in the circuit.

It is another object of the present invention to provide ohmic interconnection layers which can be defined with better resolution, for the same lithographic technique, than metal interconnection lines.

It is another object of the present invention to provide a technique for making semiconductor circuits requiring a minimum number of processing steps, in which oxide insulation layers are easily provided without adversely affecting electrical interconnection lines.

It is yet another object of the present invention to provide a static memory cell using bipolar transistors having reduced cell size.

It is another object of the present invention to provide semiconductor circuitry in which metal interconnection lines are eliminated and in which cell size is reduced, in order to reduce the capacitances within said circuit, and in which the electrical properties of the circuit can be improved.

It is a further object of the present invention to provide a technique for interconnecting opposite conductivity regions of a semiconductor material without the need for metal interconnection lines, in a manner to provide semiconductor circuits having enhanced performance characteristics.

DISCLOSURE OF THE INVENTION

A technique is provided for producing good electrical interconnections between opposite conductivity types of a semiconductor material. In particular, satisfactory interconnections can be provided without the need for metal interconnection lines.

In the most general sense, at least two layers are required between the opposite conductivity type regions of semiconductor material. One of these layers is comprised of a polycrystalline semiconductor which is the same semiconductor material as the semiconductor material in which the opposite conductivity regions are formed. The other layer is a combination of a refractory metal and the semiconductor material such as a compound of the metal and semiconductor. In the case of a silicon semiconductor device having P and N type regions, these regions can be interconnected by a layer of doped polycrystalline silicon (polysilicon) and a layer of refractory metal silicide. The polycrystalline silicon (polysilicon) has the same conductivity type as the silicon region to which it makes ohmic contact, and the silicide layer contacts the doped polysilicon layer and the other opposite conductivity type semiconductor region. In another preferred embodiment, N and P type regions are interconnected by a structure comprising a layer of N polysilicon—a layer of refractory metal silicide—and a layer of P type polysilicon.

The interconnection lines are provided by the polysilicon layer, which can have metal silicide thereover in order to reduce the resistance of the polysilicon line. Of course, it is known in the art that a metal silicide on polysilicon will reduce the resistivity of the polysilicon line. However, in the practice of the present invention, the metal silicide can be formed only in the region where the N and P type polysilicon layers are to be electrically joined rather than being formed over the entire length of the polysilicon.

When the structure is later oxidized to form an insulation layer before additional metal lines are deposited, the polysilicon layer replaces any silicon removed from the silicide layer during the oxide growth step. This ensures that the silicide layer integrity remains throughout the circuit fabrication steps.

These and other objects, features, and advantages will be more apparent from the following more particular description of the preferred embodiments.

BRIEF DESCRIPTION OF THE DRAWINGS

FIG. 2A is a side elevation view of a merged transistor logic (MTL) static memory cell, while

FIGS. 3A and 3B illustrate the improvement in cell size for the static memory cell of FIG. 2C, when the present interconnection scheme is used. In particular, FIG. 3A shows a top view of the improved memory cell, while

BEST MODE FOR CARRYING OUT THE INVENTION

Figure 1A:
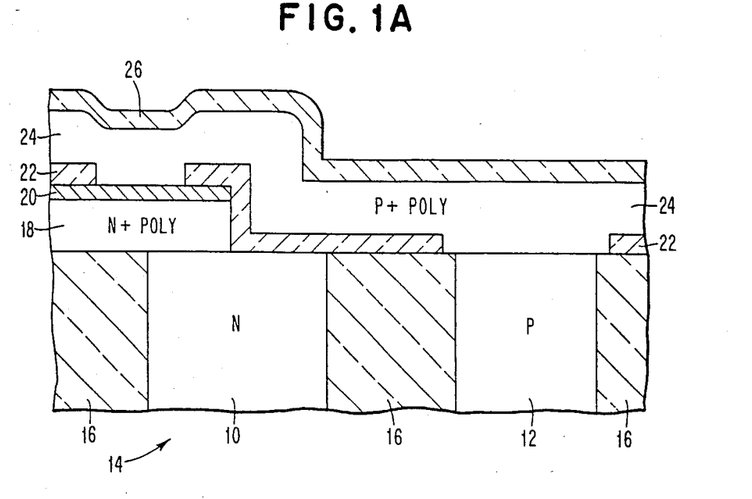
FIG. 1A illustrates an interconnection between N and P regions of a semiconductor, using intermediate layers of doped polysilicon and a refractory metal silicide.
Figure 1B:
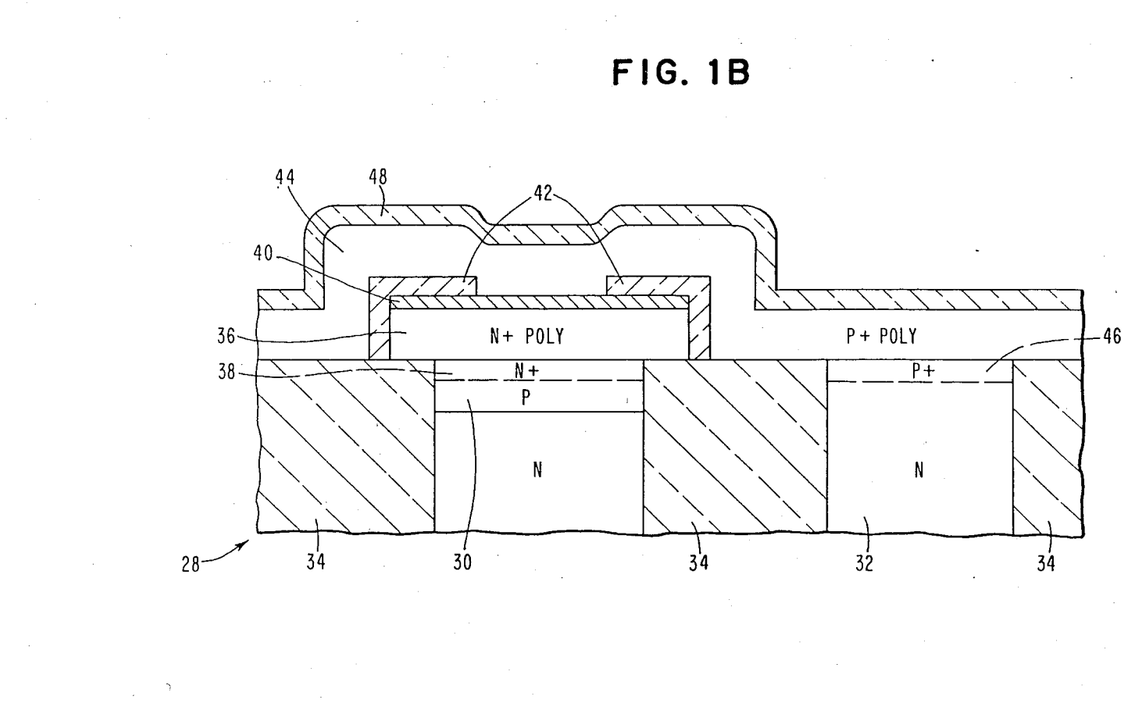
FIG. 1B shows another interconnection using doped polysilicon layers where the N+ and P+ polysilicon layers are electrically joined by a silicide layer.
Figure 1C:
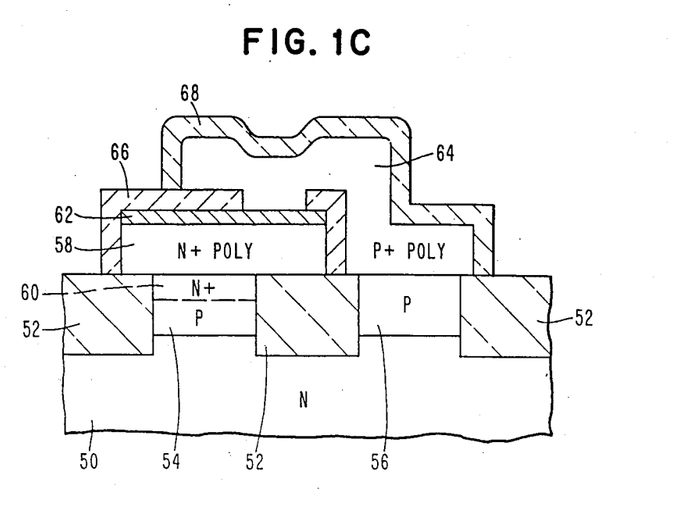
FIG. 1C shows the interconnection of P and N type semiconductor regions where impurities from the N+ polysilicon layer are used to change the conductivity type of a thin layer of P type single crystal material.

FIGS. 1A, 1B, and 1C

These figures illustrate the interconnection scheme for electrically connecting opposite conductivity regions. In FIG. 1A, it is desired to provide an adequate electrical interconnection between N type region 10 and P type region 12, both of which are located in a body of semiconductor material 14. In one embodiment, semiconductor 14 can be single crystal silicon. As is well known in the art, the semiconductor material can be doped to provide N and P type regions therein. In this structure, oxide regions 16 separate opposite conductivity regions 10 and 12 and are produced by conventional techniques. For example, semiconductor wafer 14 can be etched and silicon oxide can be deposited or grown in the etched grooves to form the oxide areas 16.

An adequate electrical interconnection is one in which the contact resistance is sufficiently low to not adversely affect circuit operations, i.e., not introduce an adversely high voltage drop. Of course, this varies depending on the circuit application. As an example, memory circuits require less current and can operate successfully even if the contact resistance is relatively high, while most logic circuits require higher currents and smaller contact resistances.

A first polysilicon layer 18, having N type conductivity, is then blanket deposited and later delineated through a mask (not shown) to contact N region 10. Polysilicon layer 18 is quite heavily doped, as indicated by the designation "N+ poly", and typically has a doping of $10^{19}$–$10^{21}$ impurities/cm$^3$. Layer 18 can be formed by chemical vapor deposition (CVD) where the dopants are typically either phosphorous or arsenic.

After the polysilicon layer 18 is doped, a refractory metal silicide layer 20 is formed on polysilicon layer 18. The same masking step is used to delineate both layer 20 and layer 18. The silicide layer 20 is a refractory metal-silicon compound, where the refractory metal is, for example, tungsten, molybdenum, tantalum, etc. The choice of a refractory metal is important, as it means that the metal silicide will be able to withstand the high temperatures required in later processing steps, as when silicon oxide layers are grown or deposited by CVD.

Metal silicide layer 20 can be provided by sputtering from a suitable target of silicide, or can be provided by coevaporation of the refractory metal and silicon.

After formation of silicide layer 20, an electrical insulating layer 22 such as silicon oxide, is provided over layer 20 and over other portions of semiconductor wafer 14. Contact openings through that insulating layer to the silicide layer 20 and the P region 12 are formed by means of a mask. A P type polysilicon layer 24 is then formed by CVD onto P type region 12, silicon oxide layer 22, and metal silicide layer 20. The doping of layer 24 is similar to that of layer 18, and is typically $10^{19}$–$10^{21}$ impurities/cm$^3$. A suitable dopant to provide P type polysilicon is boron. After formation of layer 24, another silicon oxide layer 26 is provided for electrical insulation between the polysilicon layer 24 and any metallic interconnection lines which must then be deposited. Silicon oxide layers 22 and 26 can either be grown onto the underlying polysilicon and silicide layers, or can be evaporated onto these layers.

In the practice of this invention, the highly doped polysilicon layers 18 and 24 are used to make electrical contacts to semiconductor regions 10 and 12 respectively. The interconnection between the opposite conductivity type polysilicon layers is provided by the refractory metal silicide 20. Here, the interconnection lines are provided by the polysilicon layers which often can be made smaller than metal lines for the same lithography ground rules. As will be seen more clearly with respect to the circuit of FIGS. 2A–2C, this feature can be used to provide very dense semiconductor circuitry in which opposite conductivity types have to be interconnected.

Another advantage to the present technique is that oxide insulation layers, such as layers 22 and 26, can be easily grown or deposited onto polysilicon layers or silicide layers. Since only one level of metallization may be required, only a minimum number of processing steps is required, and the structure does not suffer adverse effects when the oxide layers 22 and 26 are formed. Still further, the polysilicon layers provide silicon to the silicide layer 20 in order to replenish any silicon removed therefrom during growth of the silicon oxide layer 22. This preserves the integrity of layer 20 and ensures that a good electrical interconnection is made between N type polysilicon layer 18 and P type polysilicon layer 24.

FIG. 1B shows a variation of the structure of structure of FIG. 1A, where N type polysilicon can be formed on a P type semiconductor region and where P type polysilicon can be formed on an N type semiconductor region. In more detail, a semiconductor wafer 28 of N type conductivity has a P type region 30 therein, and a N region 32. Silicon oxide regions 34 are buried in semiconductor 28. After suitable masking, N+ polysilicon layer 36 is formed over P type region 30. Impurities from the N type polysilicon layer 36 diffuse into the top surface of P type region 30, to create an N+ region 38 therein. Thus, an electrical contact is made by polysilicon layer 36 to N+ layer 38 located on P type region 30.

A refractory metal silicide layer 40 is then formed on polysilicon layer 36, by the processes described with respect to FIG. 1A. After this, a silicon oxide layer 42 is formed over silicide layer 40 and over those portions of the semiconductor substrate 28 where P type polysilicon is not desired.

A P type layer of polysilicon 44 is then formed over insulating layer 42, silicide layer 40, and the exposed portions of semiconductor 28 and buried oxide regions 34. In an analogous manner described with respect to the formation of layers 36 and 38, impurities from the P+ polysilicon layer 44 diffuse into N type region 32 to create a thin P+ layer 46. An electrical contact exists between polysilicon layer 44 and layer 46.

Another silicon oxide layer 48 is formed over the P+ polysilicon layer 44 and is used to electrically insulate the polysilicon layer from any required overlying metal interconnection lines. In the embodiment of FIG. 1B, the process steps used to form the various layers can be the same as those described with respect to FIG. 1A, and the doping levels of these layers are those given in the description of FIG. 1A.

FIG. 1C shows an embodiment in which a P type polysilicon layer contacts a single crystal P type region, and in which an N type polysilicon layer is used to contact a N+ semiconductor region located over a P type region.

In more detail, an N type semiconductor wafer 50 has buried oxide regions 52 therein. Semiconductor 50, typically of silicon, has P type regions 54 and 56 in its top surface. An N type polysilicon layer 58 is formed over P type region 54. Impurities from layer 58 diffuse into region 54 to create a thin surface layer 60 having N+ conductivity type.

Refractory metal silicide layer 62 is formed over polysilicon layer 58, and is used to provide electrical connection to a P+ polycrystalline layer 64. Layer 64 is deposited through a layer 66 of silicon oxide, and makes electrical contact with P type region 56. In order to provide electrical isolation between the polysilicon lines and any required metal lines, silicon oxide layer 68 is formed over polysilicon layer 64.

Figure 2A:
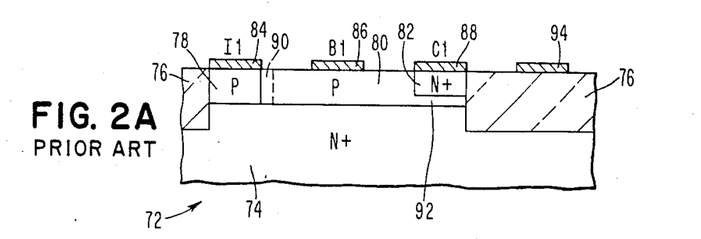
Figure 2B:
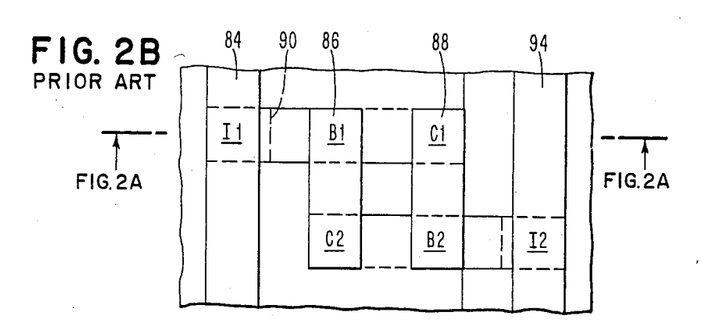
FIG. 2B is a top view of this memory cell.

CIRCUIT APPLICATIONS The interconnection scheme illustrated in FIGS. 1A-1C can be used to provide more dense semiconductor circuits in those situations where opposite conductivity type semiconductor regions have to be electrically connected. One such example is illustrated with respect to the circuit of 2C. A prior art technique for forming the circuit of 2C is shown in FIGS. 2A and 2B. FIGS. 3A and 3B illustrate an application of the present interconnection scheme for fabrication of the circuit of FIG. 2C. As will be apparent, a reduction in cell size can be achieved when this interconnection scheme is used.

Figure 2C:
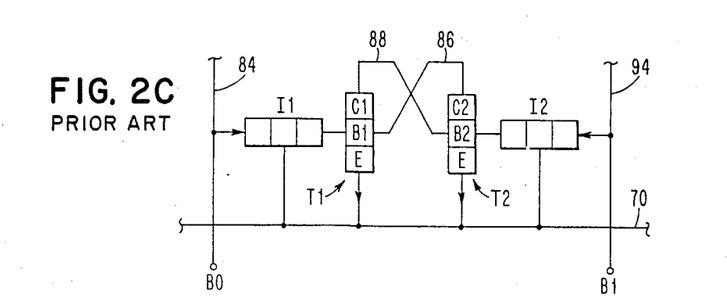
FIG. 2C is a schematic electrical diagram of the static memory cell. The width of this static memory cell is 8 units.
Figure 3A:
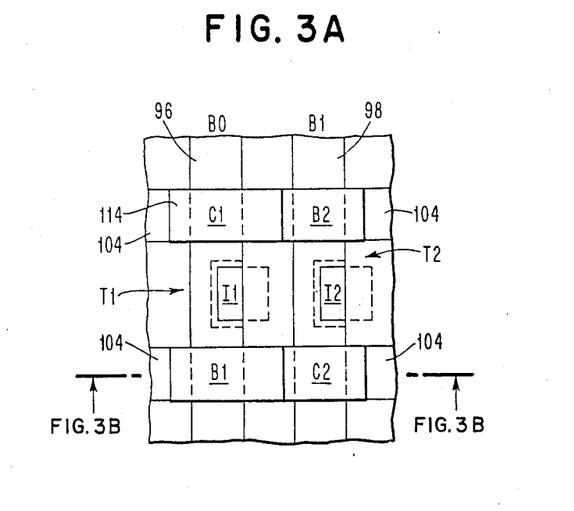
Figure 3B:
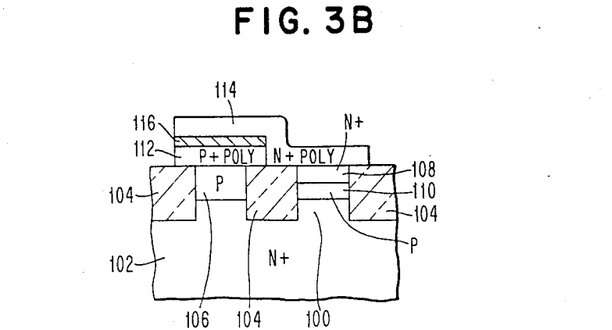
FIG. 3B shows a side elevational view of this memory cell. It should be noted that the width of the static memory cell in FIGS. 3A and 3B is one half of the width of the static memory cell of FIGS. 2A and 2B.

In more detail, the circuit of FIG. 2C illustrates a conventionally known static MTL (i.e., I$^2$L) memory cell. In this illustration, two cross-coupled NPN transistors T1 and T2 are provided with current injectors I1 and I2. Current injectors I1 and I2 are part of PNP transistors which are used to force current into the base regions of transistors T1 and T2. In a more general sense, the PNP injectors are examples of load devices (including resistors, etc.) which can be connected to transistors T1 and T2.

Transistors T1 and T2 share the same emitter, which can be a blanket N+ region in a wafer of semiconductor material. The base and collector regions of these transistors are separate from one another and are designated B1, B2, C1, and C2, respectively.

A word line 70 is provided which is typically formed as a N+ buried layer in the semiconductor wafer. Bit lines B0 and B1 are provided for electrical connection to current injectors I1 and I2.

The operation of the static memory cell of FIG. 2C is well known in the art and will not be described here. The structure and fabrication of the semiconductor wafer to provide the circuit of FIG. 2C is also known in the art, and will only be described with respect to FIGS. 2A and 2B. For additional information, reference is made to an IBM Technical Disclosure Bulletin, Vol. 21, No. 1, June 1978, at pages 231, 232.

FIG. 2A is a side elevation view of the circuit shown as a top view in FIG. 2B, taken along the line 2A—2A. Only injector I1 and transistor T1 are shown in this figure. This circuit is formed in a wafer of semiconductor material 72 including N+ emitter (E) region 74. Typically the emitter region 74 is doped to a level of approximately $10^{20}$ impurities/cm$^3$. As with the other structures described previously, buried electrical insulation regions 76 (typically silicon oxide) are provided in semiconductor material 72. A P type region 78 and another P type region 80 are formed in the top surface of semiconductor 72. Additionally, an N+ region 82 is formed in a portion of the top surface of region 80. Metal contacts 84, 86, and 88 are provided to regions 78, 80, and 82 respectively. In addition to providing ohmic contacts to these regions, metal lines 86 and 88 provide interconnection lines between opposite conductivity types of the transistors T1 and T2, and metal lines 84 (and 94), forming the bit lines provide interconnections between regions having the same conductivity type.

P type regions 78 and 80 have approximately the same doping level, being about $10^{19}$ impurities/cm$^3$. N+ region 82 has a doping level of approximately $10^{20}$ impurities/cm$^3$. In addition, the small N type region 90 located between regions 78 and 80 has a doping level of approximately $10^{16}-10^{17}$ impurities/cm$^3$. Also, the narrow P type region 92, located below N+ region 82, has a doping level of approximately $10^{17}$ impurities/cm$^3$.

The injector I1 is the emitter of a lateral PNP transistor comprising regions 78, 90, and 80. Transistor T1 is an NPN transistor comprising N+ emitter region 74, P type base region 92, and N+ region 82. The base contact is B1 and the collector contact is C1.

As is apparent from FIG. 2B, the transistors T1 and T2 are located one behind the other so that only transistor T1 is shown in FIG. 2A. The base and collector contacts B1, B2, C1, and C2, are indicated in this figure. In a similar manner, the injectors I1 and I2 are also indicated.

In FIG. 2B, the interconnection lines providing the interconnections between the injectors and the cross-coupling of the transistors T1 and T2 are metallic lines. Specifically, these are aluminum or aluminum-copper lines 84, 86, and 88. Bit line B1 (to another injector I2—not shown in FIG. 2A) is not shown in FIG. 2A but is shown as metal line 94 in FIG. 2B.

As is apparent from FIG. 2B, the cell dimension in the x direction is 8 units wide while the cell dimension in the y direction is 4 units. Thus, the area of this MTL memory cell design is 32 units.

Improved Static Memory Cell (FIGS. 3A and 3B)

These figures illustrate a circuit fabrication layout which uses the present interconnection scheme to provide the circuit of FIG. 2C. As will be readily apparent from an inspection of the drawings, the cell size in the x direction is 4 units while the cell size in the y direction is now 5 units. This means that the area of the memory cell is 20 units, which is a significant reduction with respect to the memory cell of the prior art (FIGS. 2A and 2B).

FIG. 3A is a top view of a circuit layout for providing the transistors T1 and T2, as well as the injectors I1 and I2 of FIG. 2C. Using this fabrication technique, only two metal lines 96 and 98 are required along the y direction of the memory cell, in contrast with the four metal lines which were required in the structure of FIGS. 2A and 2B. The base-collector cross connections are now provided by doped polysilicon layers rather than by metal lines. This memory cell design is 4 units wide and 5 units in the y direction, and now has an area of 20 units.

In FIG. 3B, an N+ region 100 serves as a buried emitter in a body of semiconductor material generally designated 102. Oxide regions 104 provide electrical isolation. A P type region 106 serves as the base region for transistor T1 while N+ region 108, located on the top surface of P type region 110, serves as the collector of transistor T2.

In this fabrication layout, P type region 106 also serves as the collector of the PNP transistor with injector I1, while P type region 110 serves as the collector of the PNP transistor with injector I2.

The doping levels of the emitter, base, and collector regions of transistors T1, T2, I1, and I2 are the same as those described with respect to FIG. 2A.

A P+ polysilicon layer 112 makes electrical contact to P type region 106, while an N+ polysilicon layer 114 makes electrical contact to N+ collector region 108. A refractory metal silicide layer 116 provides electrical connection between the polysilicon layers 112 and 114. The doping ranges of polysilicon layers 112 and 114 are typically the same as those described earlier.

In the present fabrication layout, the base-collector cross connections are provided by the polysilicon layer 114. While only one such layer 114 is shown in FIG. 3B, it is understood that there is another such layer, as indicated by line 114 in FIG. 3A, connecting base B2 and collector C1.

In FIG. 3A, the injectors I1 and I2 are now located internal to the structure comprising transistors T1 and T2, which are different positions than they occupied in the layout of FIG. 2B. This is due to the use of the polysilicon cross connection lines, which allows a favorable placement of the injectors with respect to the transistors T1 and T2.

The current carrying conductors 96 and 98 forming the bit lines in FIG. 3A are located over the structure indicated in cross section in FIG. 3B. A layer of silicon oxide is grown over the underlying polysilicon and silicide lines prior to formation of the metal conductors 96 and 98.

The use of polysilicon for the cross coupling interconnections between the transistors of the memory cell allows a favorable placement of the injectors and the transistors, both from an electrical standpoint and from a layout point of view. Electrically, the injectors and the transistors can be placed such that a large collector area can be provided on the PNP transistors and a small series resistance can be provided from the collecting edge to the NPN collector and base contacts. This improves circuit performance.

From a layout standpoint, the use of polysilicon cross connections between opposite conductivity types of the transistors T1 and T2 will always lead to layout designs having reduced area. While the design of FIGS. 3A and 3B illustrates a layout having significantly reduced area, other designs can be provided which will provide area reductions also. As is well known in the art, circuit layout designs are done not only with respect to the amount of area required, but also with respect to electrical isolation, electrical characteristics of the circuit, etc. As an example, a memory circuit has as a primary layout design consideration the reduction of area. In contrast with this, the layout of a logic circuit is done in a manner to provide enhanced operating characteristics, while the area of the circuit often is not of paramount importance.

The pitch of metal interconnection lines (i.e., the repeat distance when metal interconnection lines are used) is usually greater than the pitch required when polysilicon lines are used for interconnections. This means that a circuit layout using polysilicon interconnection lines will provide a more dense package than one using only metal interconnection lines. When polysilicon interconnection lines are used, the opposite conductivity type regions in the transistor can be placed as close as possible. However, when metal interconnection lines are used, the line width of the metal determines the minimum spacing required between the metal interconnection lines, and therefore the density of the structure is limited. By using polysilicon interconnection lines, the opposite conductivity type regions of the transistors can be placed very close to one another.

In the practice of this invention, a primary consideration is that this interconnection scheme reduces the number of connection lines per level of fabrication which are necessary for cell wiring. In the design of FIGS. 3A and 3B, for example, the number of line interconnections per fabrication level has been reduced to 2, instead of 4 (as illustrated by the layout of FIG. 2B).

While the advantage of area reduction has been illustrated with respect to a memory cell, it will be understood by those of skill in the art that this interconnection scheme can be used in applications other than memory cells. It will also be appreciated that layout designs can be provided having reduced area, but that the amount of reduction in area is often balanced against the electrical characteristics of the circuit itself. Thus, a designer may not require excessive reductions in area but will balance the area reductions against the operating characteristics of the circuit. Regardless of the ground rules for layout design, the interconnection scheme described herein can be used to electrically interconnect opposite conductivity type regions and can therefore be used to reduce the number of connection lines per level.

Figure 4:
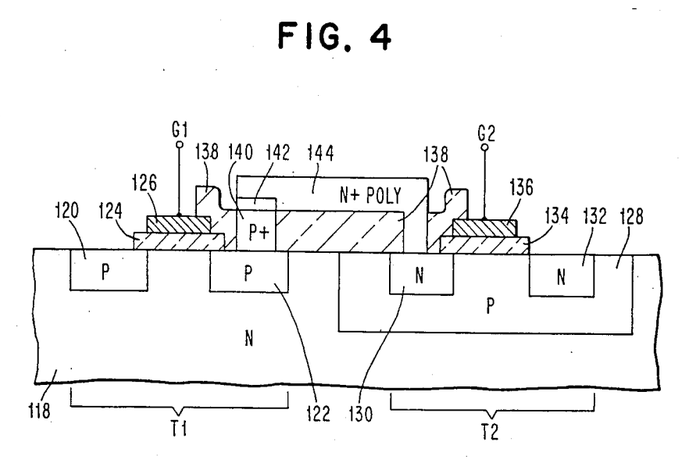
FIG. 4 illustrates the application of the present interconnection scheme in a complementary metal—oxide—silicon (CMOS) circuit.

FIG. 4 shows the use of the subject interconnection scheme in a transistor circuit comprising complementary metal-oxide-semiconductor (CMOS) devices in the top surface of a N type semiconductor wafer 118. MOS transistor T1 is a P-channel device while MOS transistor T2 is a N-channel device. P type regions 120 and 122 are used for the source and drain regions of transistor T1, which includes an overlying gate oxide 124 and a conductor electrode 126. A conductor connection to electrode 126 is indicated as G1.

A P type region 128 is formed in a portion of the top surface of semiconductor 118, and forms the substrate into which N type regions 130 and 132 are formed. Regions 130 and 132 provide the source and drain regions of transistor T2 while P type region 128 provides the N-channel of this transistor. Gate oxide 134 is a silicon oxide layer located over the channel of this transistor, while gate electrode 136 is a conductor layer overlying gate oxide 134. A line contacts electrode 136, as indicated by the designation G2.

Polysilicon layers and an intermediate silicide layer are used to interconnect P region 122 of transistor T1 and N region 130 of transistor T2.

A silicon oxide layer 138 is formed which prevents the formation of a polysilicon layer on certain portions of the top surface of semiconductor 118. After this, a P+ polysilicon layer 140 is used to make electrical contact to P type region 122, and a refractory metal silicide 142 is formed on P type polysilicon layer 140. An N+ polysilicon layer 144 is then used to make electrical contact to N type region 130 in transistor T2. Polysilicon layer 144 is also connected to polysilicon layer 140 via the intermediate silicide layer 142. Thus, an electrical interconnection is provided between opposite conductivity types in this CMOS circuit using polysilicon as the interconnection line.

Figure 5:
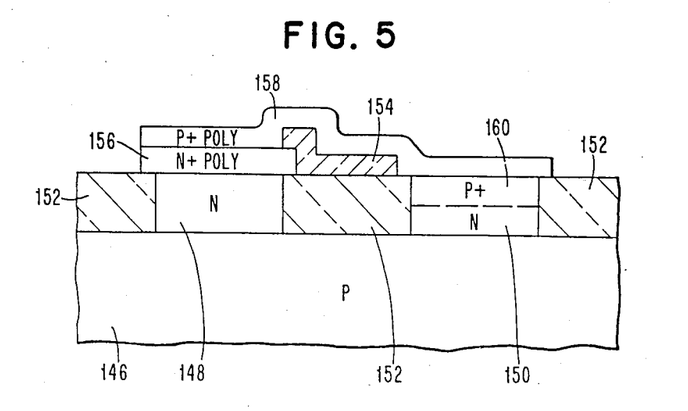
FIG. 5 illustrates an electrical interconnection between opposite semiconductor type regions, using only highly doped P type polysilicon and highly doped N type polysilicon. That is, no silicide layer is required intermediate the two opposite conductivity type polysilicon layers. This type of interconnection is not as ohmic as the interconnections using the silicide layer, but may be satisfactory, particularly if the devices require only low currents.

Alternative Interconnection (FIG. 5) FIG. 5 shows another possible interconnection technique wherein a P+ polysilicon layer is in contact with a N+ polysilicon layer. That is, no intermediate silicide layer is used. This interconnection technique provides a quasi-ohmic contact and may be suitable for interconnections in low current devices. The doping levels of the N+ polysilicon and P+ polysilicon lines should be of the magnitude $10^{20}$ impurities/cm$^3$ for this type of interconnection to be a suitable one.

In more detail, a P type semiconductor material 146 has N type regions 148 and 150 in its top surface. Silicon oxide regions 152 are buried in the top surface of semiconductor 146. A layer of silicon oxide 154 is formed over a portion of the device shown in FIG. 5, and an N+ polysilicon layer 156 is used to make electrical contact to N type region 148. A P+ polysilicon layer 158 is formed over N type region 150, and impurities from this polysilicon layer diffuse into the top surface of region 150, to form a thin P+ layer 160.

Rather than using an intermediate silicide layer between the opposite conductivity type polysilicon layers 156 and 158, these layers directly contact one another. In order to provide an adequate electrical interconnection between these polysilicon layers, very heavy doping must be used for both of the polysilicon lines, and for this reason a doping density greater than $10^{20}$ impurities/cm$^3$ is preferred.

While the invention has been particularly described with respect to silicon semiconductive material, the principals of the invention are applicable to other semiconductive materials also. For example, polycrystalline layers of germanium can be used to form electrical contacts to P and N germanium regions and refractory metal compounds can be formed with germanium. Another possible semiconductor material that can be utilized with this interconnection scheme is gallium arsenide, since polycrystalline layers of this material can be formed and refractory metals can be used to form compounds with gallium arsenide.

It will be understood by those of skill in the art that the present invention can be applied to any type of semiconductor circuitry where electrical interconnections are required between opposite conductivity regions. In its most general sense, the interconnection scheme uses a polycrystalline layer of the semiconductor material and a combination (such as a compound) of that semiconductor material with a refractory metal. The preferred compound for use herein is one which has high electrical conductivity and which will provide a good electrical connection (i.e., a sufficiently low voltage drop) between opposite conductivity type polycrystalline layers. Of course, alloys of refractory metals and the semiconductor material can also be used between the polycrystalline semiconductor layers.

While the invention has been particularly shown and described with reference to preferred embodiments thereof, it will be understood by those of skill in the art that changes can be made in form and details without departing from the spirit and scope of the invention.

What is claimed is:

1. A semiconductor memory circuit, comprising:
a body of silicon single crystal semiconductor material having at least two cross-coupled bipolar transistors formed in a memory cell therein, wherein each of said transistors includes electrical base, collector, and emitter regions, said transistors being arranged in an improved dense layout, said layout including
a sufficiently low voltage drop electrical interconnection forming said cross-coupling between an electrical base region of one transistor and an electrical collector region of the second transistor, said cross-coupling interconnection comprising:
a refractory metal silicide layer contacting one of said base or collector regions in one of said first and second transistors and forming an electrical contact therewith, and
a polycrystalline silicon layer in contact with the other of said base or collector regions in the other of said first and second-transistors and sufficiently doped to form a sufficiently low voltage drop electrical contact therewith, said polycrystalline layer also being in contact with said layer of refractory metal silicide and forming a multi-level sandwich structure, an electrical insulation layer formed over said silicide layer and said polycrystalline silicon layer, a first electrical conductor located on said insulation layer and extending over the area in which said electrical interconnection is formed, at least one additional electrical conductor formed in the same fabrication level as said first conductor and located laterally outside of the area occupied by said interconnection, additional bipolar transistors electrically connected to said first conductor and said additional conductor, and to said two bipolar transistors, said additional bipolar transistors being located in said semiconductor material and between said two bipolar transistors.

2. A semiconductor memory circuit comprising a body of single crystal semiconductor material having two cross-coupled bipolar transistors formed in a memory cell therein wherein each said bipolar transistor includes electrical base, collector, and emitter regions, an electrical interconnection coupling said two transistors and forming said cross coupling between an electrical base region of one transistor and an electrical collector region of the second transistor, said cross-coupling electrical interconnection being comprised of:

a first polysilicon layer of a first conductivity-type being in contact with said base region of one transistor, the doping level of said first polysilicon layer being sufficiently high that a sufficiently low voltage drop electrical contact is formed to said base region, a refractory metal silicide layer in contact with said first polysilicon layer, and a second polysilicon layer of opposite conductivity-type in contact with said collector region of said second transistor and having a sufficiently high doping level to provide a sufficiently low voltage drop contact to said collector region, said second polysilicon layer also being in contact with said refractory metal silicide layer, where said silicide layer is located between said first and second polysilicon layers in a multilayer sandwich structure, a layer of oxide insulation on said polysilicon layers, a first electrical conductor located over said oxide insulation and extending over the area in which said first and second polysilicon layers form said electrical interconnection to said base and collector regions, at least one additional electrical conductor formed in the same fabrication level as said first conductor and located laterally outside the area occupied by said first conductor, an additional bipolar transistor electrically connected to at least one of said first conductor and said additional conductor, and to at least one of said two bipolar transistors, said additional bipolar transistor being located in said semiconductor material and between said two bipolar transistors.

* * * * *